United States Patent [19]

Schonstedt

[11] 4,388,592
[45] Jun. 14, 1983

[54] MULTIAXIS MAGNETOMETER APPARATUS WITH ORTHOGONALLY DISPOSED RECTANGULAR HOUSINGS FOR MOUNTING SEPARATE SENSOR ASSEMBLIES

[75] Inventor: Erick O. Schonstedt, Reston, Va.

[73] Assignee: Schonstedt Instrument Company, Reston, Va.

[21] Appl. No.: 162,488

[22] Filed: Jun. 24, 1980

[51] Int. Cl.³ .................. G01R 33/02; G01R 33/04
[52] U.S. Cl. ..................................... 324/247; 324/253
[58] Field of Search ........................... 324/244–247, 324/253–255, 258, 260, 343, 326, 329, 345, 346, 331, 334; 33/304, 352, 355 R, 361

[56] References Cited

U.S. PATENT DOCUMENTS

| | | | |
|---|---|---|---|
| 2,379,447 | 7/1945 | Lindsey | 324/247 X |
| 2,744,232 | 5/1956 | Shawhan et al. | 324/329 |
| 2,777,112 | 1/1957 | Coker et al. | 324/345 |
| 3,317,821 | 5/1967 | Patton et al. | 324/346 |
| 3,500,175 | 3/1970 | Ronka | 324/334 |
| 3,961,245 | 8/1976 | Schonstedt | 324/43 |
| 4,292,590 | 9/1981 | Wilson | 324/244 X |

FOREIGN PATENT DOCUMENTS 648774 9/1962 Canada ........................ 324/346

Primary Examiner—Gerard R. Strecker
Attorney, Agent, or Firm—Shapiro and Shapiro

[57] ABSTRACT

A structure is disclosed for mounting separate magnetic sensor assemblies in a magnetometer and the like with the axes of the respective assemblies disposed in mutually orthogonal planes. In a preferred form, the structure comprises three separate elongated housings of rectangular cross section for carrying three separate sensor assemblies. The housings are connected together so that two housings cross one another at right angles and are centered lengthwise with respect to one another. The third housing is connected to one of the first or second housings with its axis disposed at right angles to each and being centered lengthwise with respect to each. Also disclosed is a suspension assembly for suspending the structure in an outer casing, the suspension assembly including a gimbal arrangement whereby the structure is free to swing about a pair of mutually perpendicular gimbal axes.

16 Claims, 5 Drawing Figures

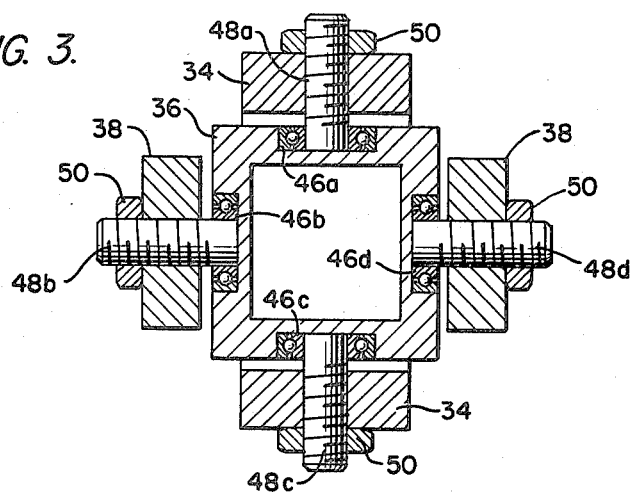
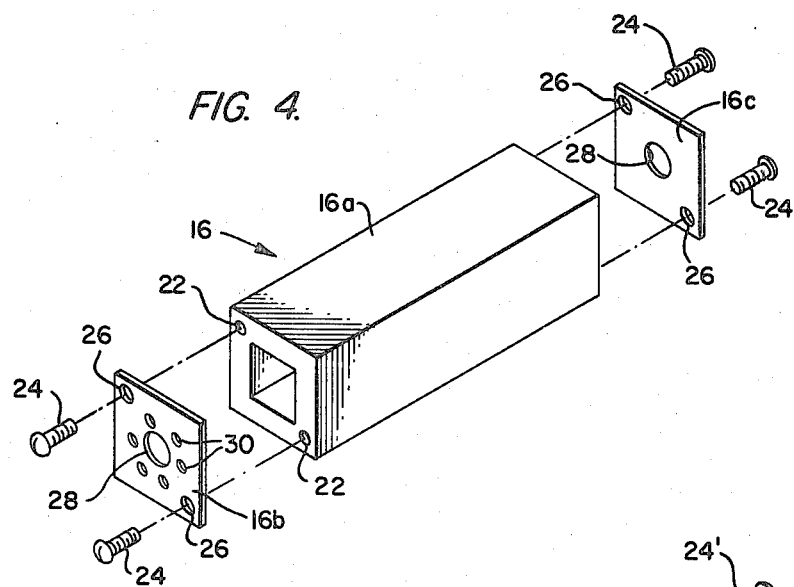
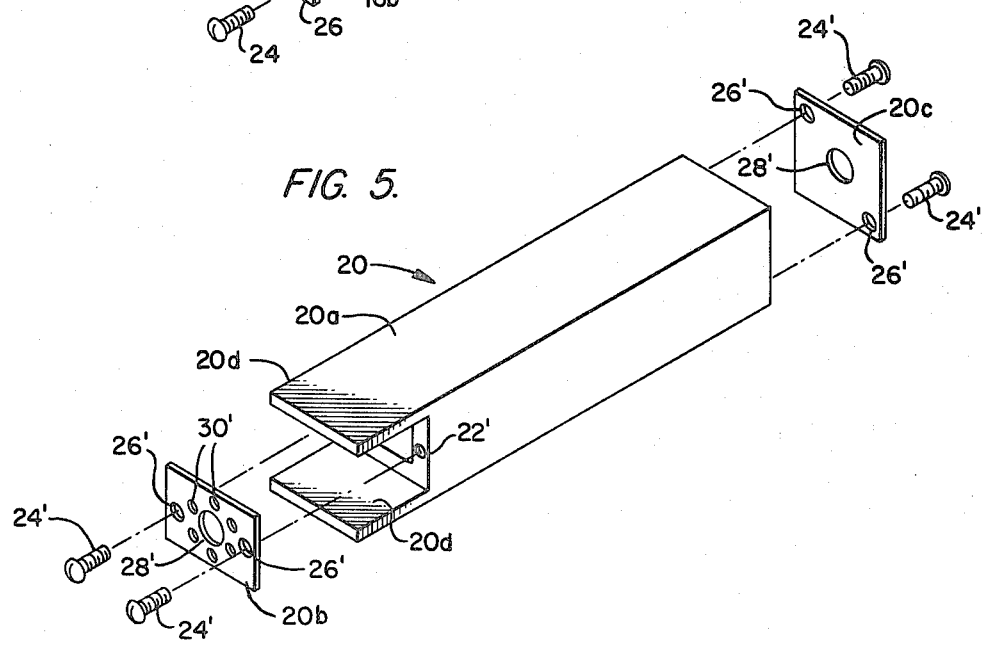

MULTIAXIS MAGNETOMETER APPARATUS WITH ORTHOGONALLY DISPOSED RECTANGULAR HOUSINGS FOR MOUNTING SEPARATE SENSOR ASSEMBLIES

BACKGROUND OF THE INVENTION

This invention relates to a multi-axis magnetic field sensing apparatus, commonly referred to as a magnetometer, and more particularly to a structure for use in such apparatus to mount magnetic sensing assemblies with their sensitive axes disposed in mutually orthogonal planes.

Multi-axis magnetometers employing separate magnetic flux sensors arranged with their sensitive axes in mutually orthogonal planes are well known for use in determining the sense and/or magnitude of randomly oriented magnetic field vectors and the like. The present invention is not concerned with the magnetic and electronic design of such instruments, but merely with the mechanical construction of a mounting structure for carrying the separate sensor assemblies with their respective axes disposed in the correct orthogonal relationship.

Magnetometers tend, by their nature, to be sensitive instruments requiring accurate mounting and alignment of the respective sensor assemblies for optimum results and it is further desirable that the assemblies be housed in a manner which minimizes the effects of undersirable outside influences, such as physical shock or changes in the orientation of a vehicle or the like on which the magnetometer is carried.

SUMMARY OF THE INVENTION

It is an object of the invention to provide a novel form of structure for mounting magnetic sensor assemblies in a magnetometer with the axes of the respective assembles disposed in mutually orthogonal planes.

Another object of the invention is to provide a structure as outlined in the preceding paragraph which is compact in design.

Another object of the invention is to provide a structure as previously referred to which is simple and relatively economical to manufacture by duplication of certain components.

A further object of the invention is to provide a mounting structure as referred to which includes a suspension assembly whereby the structure can be suspended in an adjustable manner in an outer casing.

Yet another object of the invention is to provide a mounting structure for the purpose indicated which includes means whereby the axial alignment of the individual sensor assemblies can be finely adjusted.

Particularly with the above objects in view, the invention provides, in its broadest aspect, a mounting structure for a plurality of sensor assemblies comprising separate elongated housings of rectangular cross section for the respective assemblies, the housings being connected together with their longitudinal axes extending in mutually orthogonal planes. In one preferred embodiment, the structure includes three such housings connected together so as to define orthogonally arranged X, Y and Z axes for three sensor assemblies.

Preferably, a pair of the housings are connected together in crossing relationship with surface-to-surface contact and with each housing being centered lengthwise with respect to the other and the third housing is connected to one or other of said pair of housings so that its longitudinal axis is centered lengthwise with respect to each of said pair of housings. With this arrangement, one of said pair of housings may conveniently be attached to a suspension assembly for suspending the structure in an outer casing, so that the housing extends horizontally to define say the Y axis, the second of said pair of housings may be connected beneath the first housing to define a horizontally extending X axis, and the third housing may be connected beneath the second housing to define a vertically extending Z axis. The housings defining the X and Y axes may be identical in construction and each housing may include detachable end plates adapted to mount a sensor assembly within tthe housing with its longitudinal axis aligned with the housing axis. The end plates may include means for finely adjusting the alignment of the sensor axis relative to the axis of the respective housing.

A suitable suspension assembly for the mounting structure preferably includes a gimbal arrangement permitting pendulum-like movement of the assembly about axes parallel to the X and Y axes, respectively, and the structure may include means for adjusting the balance thereof with respect to both gimbal axes.

A preferred embodiment of the invention will be described by way of example only, with reference to the accompanying drawings.

BRIEF DESCRIPTION OF THE DRAWINGS

FIG. 3 is a sectional plan view on line 3—3 of FIG. 1;

FIG. 4 is an exploded perspective view of a sensor housing; and

FIG. 5 is an exploded perspective view of another sensor housing.

DESCRIPTION OF PREFERRED EMBODIMENT

Figure 2:
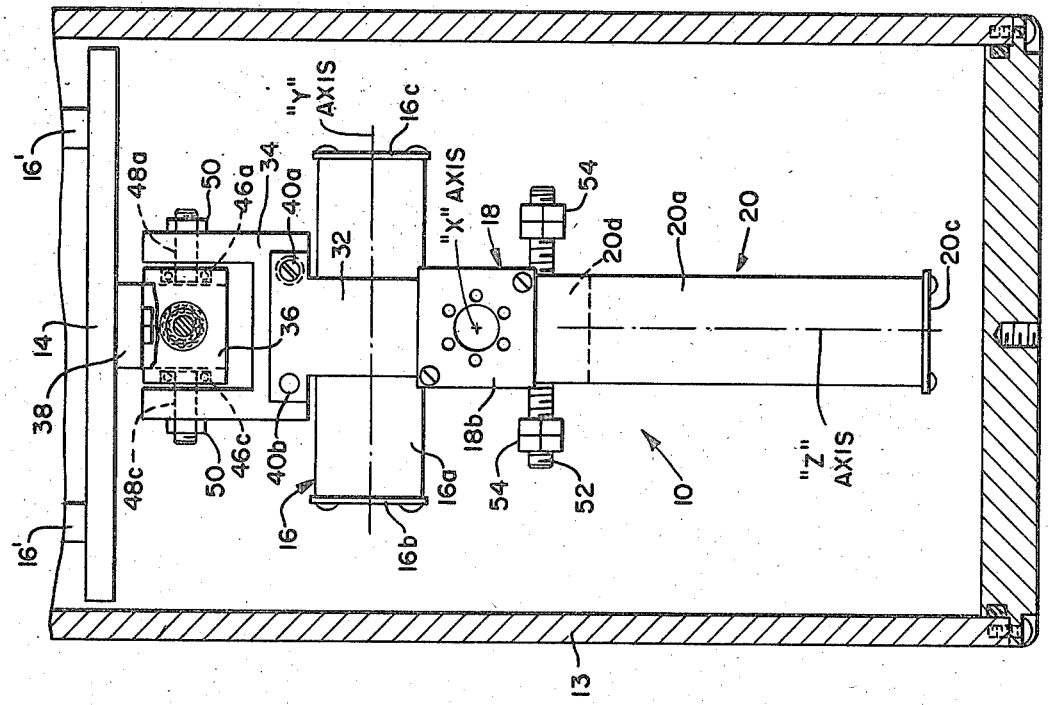
FIG. 2 is an end view of the structure shown in FIG. 1.
Figure 1:
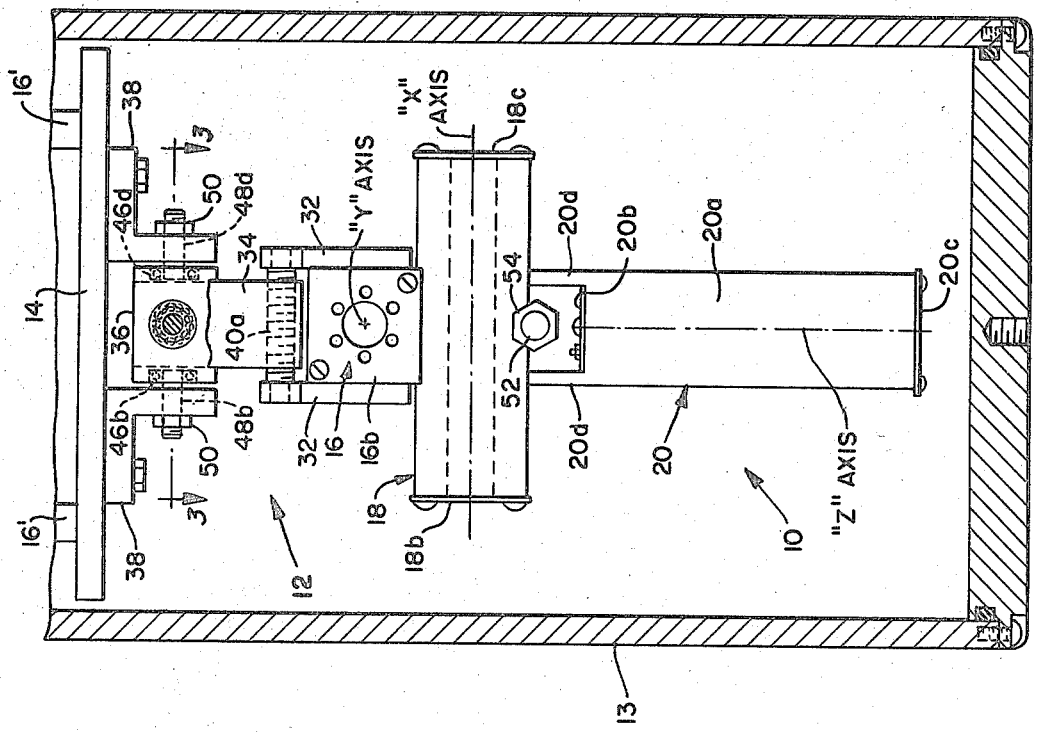
FIG. 1 is a side view of a mounting structure for a three-axis magnetometer shown suspended in an outer casing.

The illustrated sensor mounting structure 10 is shown in FIGS. 1, 2 and 3 suspended in an outer magnetometer casing 13, the top of which is not shown in the drawings. Mounting structure 10 is suspended by support means comprising a suspension assembly 12 from a plate 14 connected to casing 13 by suspension rods 16 or the like. The construction of casing 13 and the manner in which plate 14 is connected thereto does not form part of the present invention and any suitable means known in the art may be employed for attaching the plate in the casing in a removable and sealed manner. The present invention is concerned solely with the mechanical construction of mounting structure 10 and suspension assembly 12. It will be readily apparent moreover, to those skilled in the art, that the various components shown in the drawings are made from non-magnetizable materials, known for use in magnetometers.

Mounting structure 10 consists of an upper elongated tubular housing 16 of rectangular cross section, an intermediate housing 18 which may be of identical construction to housing 16 and a lower elongated tubular housing 20 also of rectangular cross section, each of the housings being made of a non-magnetizable material, for example, aluminum. The construction of housing 16 is shown in detail in FIG. 4 (housing 18 being identical to housing 16 is not shown separately in detail), and housing 20 is shown in detail in FIG. 5.

As shown in FIG. 4, housing 16 consists of a tubular body section 16a of rectangular cross section, which may for example be an aluminum extrusion, and rectangular end plates 16b and 16c. Body section 16a is provided with tapped holes 22 at the corners of its end faces for attachment of the end plates, by means of fastener elements in the form of screws 24 and aligning openings 26 in the end plates. The end plates serve to mount an elongated sensor assembly in housing 16 and to this end may be provided with central openings 28 in which the opposed ends of a sensor assembly bobbin or the like are a tight fit. End plate 16b may also have a further series of openings 30 for the various sensor assembly terminals or leads. It will be understood that the openings 28 and 30 are suitably adapted to the particular sensor assembly to be used, as are the length and cross sectional dimension of housing 16. Conveniently the openings 26 in at least one of the end plates may be made oversized with respect to screws 24 to provide a clearance which affords a convenient means for finely adjusting the alignment of the sensor assembly axis with respect to the longitudinal axis of housing 16. End plates 16b and 16c may also be made of a non-magnetizable material such as aluminum or a hard plastic.

As indicated, housing 18 may be of identical construction to housing 16 and need not, therefore, be described in detail. Like reference numerals are used to denote like parts of the respective housings.

Housing 20 is of similar construction to housings 16 and 18 and again, like reference numerals (primed) are used to denote like parts. In this case, however, two opposed side walls of body section 20a are extended to form limbs 20d and end plate 20b is shaped to fit within the opposed limbs. The openings 26' in end plate 20b and the tapped holes 22' in the corresponding end of body section 20a are also relocated as shown. Otherwise, the construction of housing 20 is substantially the same as the other housings and body section 20a may again be made from an extrusion which is cut away to form limbs 20d or alternatively the body section can be fabricated from aluminum plate.

To form the mounting structure 10, the upper wall of housing 18 may be welded to the under wall of housing 16 such that the longitudinal axes of the housings cross at right angles and with each housing centralized lengthwise of the other, whereby housing 16 defines, for example, the horizontal Y axis of the structure and housing 18 defines a horizontal X axis. The faces of limbs 20d of housing 20 may be welded to the undersurface of housing 18 so that the longitudinal axis of housing 20 defines a vertical Z axis of the structure, this axis being centralized lengthwise of both housings 16 and 18. With this arrangement, the limbs 20d define a space for gaining access to the terminals of a sensor assembly carried in housing 20. As an alternative to welding the housings together to provide connecting means therebetween, they can be attached by other connecting means, for example, suitable screws and brackets and the like.

The structure 10 heretofore described provides a compact discrete unit for mounting sensor assemblies in a three-axis magnetometer. Further, the rectangular form of housings 16–20 facilitates assembly of the housings with the correct orthogonal relationship between the respective housing axes. Slight misalignments of the sensor axes can moreover, in use, be taken into account by the fine adjustment facility of the housing end plates as previously referred to.

Suspension assembly 12 consists essentially of a pair of T-shaped brackets 32, a yoke member 34, a gimbal block 36 and a pair of angle-section brackets 38.

Brackets 32 are attached, for example, by welding to opposed side walls of housing 16 and these brackets are further attached to yoke member 34 by rods 40a and 40b inserted in bores in the yoke member, the rods having reduced diameter ends fitting in aligned openings in brackets 32. Rod 40a and the corresponding bore in yoke member 34 have complementary threads (see FIG. 1) and at least one end of rod 40a has a screwdriver formation as shown in FIG. 2. Rod 40b may, by contrast, have a plane sliding fit in the corresponding bore in yoke member 34. The screw mounting of rod 40a allows for lateral adjustment of the position of housing structure 10 relative to yoke member 34, for example, for balancing purposes in the direction of the X axis.

Gimbal block 36 may for example be a short length of rectangular section aluminum tubing of like form to the tubing used for housings 16–20 and the side faces of the block are drilled to receive ball bearings 46a, 46b, 46c and 46d. Opposed bearings 46a and 46c connect to the opposed limbs of the yoke member 34 by screw rods 48a, 48c which fit into the inner races of the respective bearings and pass through corresponding openings in the yoke member. Nuts 50 are provided for the ends of the rods. Bearings 46b and 46d connect the gimbal block to brackets 38 in a similar manner through screwed rods 48b, 48d, openings in brackets 38 and further nuts 50. Brackets 38 may be welded or screwed to plate 14. The configuration of the gimbal block 36, yoke member 34, and brackets 38 is such that the mounting structure 10 is free to swing about a pair of axes defined by the respective bearings 46 and rods 48 which are parallel to the X and Y axes of the structure.

As indicated above, the balance of structure 10 in the direction of the X axis can be adjusted by means of screwed rod 40a. For adjusting the balance in the direction of the Y axis, a further screwed rod 52, which may have a flattened central section, is attached, as by welding, to the undersurface of housing 18. Adjusting weights 54 are screwed onto rod 52 whereby balancing adjustments can be made by appropriately screwing the weights along the rod so as to alter the weight distribution of the structure. Thus, the balance of the structure can be effectively adjusted relative to both gimbal axes.

The structure 10, as previously referred to, is intended for mounting elongated individual magnetic sensor assemblies of the flux gate type, each having an axis of sensitivity, in the respective housings 16, 18 and 20. Such assemblies are well known in the art and do not themselves form part of the present invention. Typical assemblies of this nature comprise a casing or bobbin of non-magnetic material housing a sensor core having excitation and signal windings (see for example my earlier U.S. Pat. Nos. 3,076,930, issued Feb. 5, 1963 and 2,981,885, issued Apr. 25, 1961). In assembling a sensor assembly in one of the housings, the bobbin is fitted in the central opening 28 of the relevant end cap, this opening, as described, being made such that the bobbin is a tight fit therein. The various sensor leads are taken through the openings 30 or, the plate may carry terminals to which the leads are attached. The sensor assembly and attached plate may then be inserted in the housing and the opposite end plate fitted onto the other end of the sensor bobbin. The end plates are then screwed down onto the housing, after making any necessary adjustment for misalignment of the respective axes. One sensor assembly of the type referred to is shown in phantom line in FIG. 1. It will be understood that the various sensor leads extending from the housings 16-20 will be led out of casing 12 in a conventional manner.

While only a single embodiment of the invention has been described herein in detail, it is to be understood that the invention is not limited thereby, and modifications may be made within the scope of the attached claims.

I claim:

1. A structure for mounting a plurality of separate magnetic sensor assemblies in a multi-axis magnetometer and the like, comprising a plurality of non-magnetic elongated housings of rectangular cross section, means mounting a separate sensor assembly in each of said housings with the sensitive axis of the assembly substantially aligned with the longitudinal axis of the housing, connecting means connecting said housings together into a discrete unit with the longitudinal axes of the housings disposed in mutually orthogonal planes and with elongated planar surfaces of the respective housings in surface-to-surface contact, and support means independent of said connecting means for supporting said unit in an outer casing and the like.

2. A structure as defined in claim 1, for mounting three sensor assemblies with their sensitive axes disposed in mutually orthogonal planes, wherein said housings comprise first and second housings, the longitudinal axes of which define mutually orthogonal X and Y axes, respectively, said first and second housings crossing one another and being centralized lengthwise each with respect to the other and a third housing, the longitudinal axis of which defines a Z axis disposed orthogonally with respect to both said X and Y axes, said third housing being connected to one of said first and second housings and having its longitudinal axis centralized lengthwise with respect to each of said first and second housings.

3. A structure as defined in claim 2, wherein the support means includes a suspension assembly connected to one of said housings for suspending the structure in the outer casing and the like.

4. A structure as defined in claim 3, wherein said one of said housings connected to said suspension assembly is adapted to be suspended by said assembly with its longitudinal axis disposed horizontally and with the others of said housings disposed beneath said one housing.

5. A structure as defined in claim 3, wherein said suspension assembly is connected to said first housing so as to suspend said first housing with its axis disposed horizontally, said second housing being connected beneath said first housing and said third housing being connected beneath said second housing.

6. A structure as defined in claim 3, wherein said suspension assembly includes a gimbal means for providing freedom for said structure to pivot pendulumwise about a pair of mutually orthogonal horizontal gimbal axes.

7. A structure as defined in claim 6, wherein said gimbal axes are disposed respectively in parallel with the longitudinal axes of two of said housings.

8. A structure as defined in claim 6, including adjustment means for altering the balance of said structure relative to at least one of said gimbal axes.

9. A structure as defined in claim 8, wherein said adjustment means includes means for moving the position of said structure laterally with respect to said gimbal means.

10. The structure as defined in claim 8, wherein said adjustment means includes means for changing the weight distribution of the structure.

11. The structure as defined in claim 1, wherein said means for mounting said sensor assemblies in said housings includes means for adjusting the alignment of the sensor axes with respect to the axes of the respective housings.

12. A structure as defined in claim 11, wherein the means for mounting each sensor assembly in the respective housing comprises housing end plates in which the sensor assembly is carried and wherein the means for adjusting the alignment of the sensor assembly comprises means for adjusting the position of at least one of the end plates relative to the housing.

13. A structure as defined in claim 12, wherein the means for adjusting the position of said at least one of the end plates includes aligned openings in the end plate and the housing for receiving fastener elements, the openings in the end plate being oversize with respect to the fastener elements.

14. A structure for mounting a plurality of separate magnetic sensor assemblies in a multi-axis magnetometer and the like, comprising a plurality of non-magnetic elongated housings of rectangular cross section, means for mounting a separate sensor assembly in each of said housings with the sensitive axis of the assembly substantially aligned with the longitudinal axis of the housing, and means connecting said housings together with their longitudinal axes disposed in mutually orthogonal planes and with elongated planar surfaces of the respective housings in surface-to-surface contact, said housings comprising first and second housings, the longitudinal axes of which define mutually orthogonal X and Y axes, respectively, said first and second housings crossing one another and being centralized lengthwise each with respect to the other and a third housing, the longitudinal axis of which defines a Z axis disposed orthogonally with respect to both said X and Y axes, said third housing being connected to one of said first and second housings and having its longitudinal axis centralized lengthwise with respect to each of said first and second housings, said third housing including limbs extending longitudinally from one end of the housing, said limbs having end surfaces connected in surface-to-surface contact with said one of said first and second housings.

15. A structure as defined in claim 14, wherein said limbs comprise extensions of opposite side walls of said third housing.

16. A structure for mounting a plurality of separate magnetic sensor assemblies in a multi-axis magnetometer and the like, comprising a plurality of non-magnetic elongated housings of rectangular cross section, means for mounting a separate sensor assembly in each of said housings with the sensitive axis of the assembly substantially aligned with the longitudinal axis of the housing, and means connecting said housings together with their longitudinal axes disposed in mutually orthogonal planes and with elongated planar surfaces of the respective housings in surface-to-surface contact, wherein said means for mounting said sensor assemblies in said housings includes means for adjusting the alignment of the sensor axes with respect to the axes of the respective housings, the means for mounting the sensor assemblies comprising housing end plates in which the sensor assemblies are carried, the means for adjusting the alignment of the sensor assemblies comprising means for adjusting the position of at least one of the end plates of each housing relative to the respective housing, the means for adjusting the position of said at least one of the end plates includes aligned openings in the end plate and the housing for receiving fastener elements, the openings in the end plate being oversized with respect to the fastener elements, and wherein the openings in the housing are situated at the corners of the housing.

* * * * *